(12) United States Patent
Ren et al.

(10) Patent No.: US 12,330,933 B2
(45) Date of Patent: Jun. 17, 2025

(54) CANTILEVER STRUCTURE WITH INTERMEDIATE SUBSTRATE CONNECTION HAVING A FILM WITH ON ANCHOR WITH PROTRUSION

(71) Applicant: xMEMS Labs, Inc., Santa Clara, CA (US)

(72) Inventors: Jye Ren, Taipei (TW); Jemm Yue Liang, Sunnyvale, CA (US); Wen-Chien Chen, New Taipei (TW)

(73) Assignee: xMEMS Labs, Inc., Santa Clara, CA (US)

( * ) Notice: Subject to any disclaimer, the term of this patent is extended or adjusted under 35 U.S.C. 154(b) by 71 days.

(21) Appl. No.: 18/476,343

(22) Filed: Sep. 28, 2023

(65) Prior Publication Data
US 2024/0199410 A1    Jun. 20, 2024

Related U.S. Application Data

(60) Provisional application No. 63/433,763, filed on Dec. 20, 2022.

(51) Int. Cl.
*B81B 3/00* (2006.01)

(52) U.S. Cl.
CPC ..... *B81B 3/0097* (2013.01); *B81B 2203/0118* (2013.01); *B81B 2203/0307* (2013.01)

(58) Field of Classification Search
CPC ....... B81B 3/0097; B81B 7/00; B81B 7/0003; B81B 7/0022; B81B 7/0016; B81B 7/0045; B81B 7/0058; B81B 7/0074; B81B 2201/0257; B81B 2201/003; B81B 2201/014; B81B 2203/0118; B81B 2203/04; B81B 2203/0315; B81B 2203/0307; B81B 2203/00; B81B 2203/01; H01H 59/0009
USPC .................................... 310/309, 308, 12.03
See application file for complete search history.

(56) References Cited

U.S. PATENT DOCUMENTS

| | | | | |
|---|---|---|---|---|
| 4,893,048 A | * | 1/1990 | Farrall | H01H 57/00 310/331 |
| 5,235,225 A | * | 8/1993 | Colgate | H02N 1/004 310/22 |
| 5,304,970 A | * | 4/1994 | Okamoto | H01H 51/229 335/78 |
| 5,757,255 A | * | 5/1998 | Noda | H01H 50/642 335/78 |
| 5,856,722 A | * | 1/1999 | Haronian | H03H 9/50 310/309 |
| 5,909,162 A | * | 6/1999 | Ikeda | H01H 1/56 335/133 |

(Continued)

FOREIGN PATENT DOCUMENTS

| | | |
|---|---|---|
| CN | 106664075 A | 5/2017 |
| JP | 7-221323 A | 8/1995 |

(Continued)

*Primary Examiner* — Maged M Almawri
(74) *Attorney, Agent, or Firm* — Winston Hsu (57) ABSTRACT

A cantilever structure includes an anchor portion and a film structure. The film structure covers over a cavity and vibrates within the cavity. A length of the film structure is less than a width of the film structure. The anchor portion includes at least one protrusion protruding toward the cavity, and the film structure is anchored on the anchor portion with the at least one protrusion.

21 Claims, 9 Drawing Sheets

(56) References Cited

U.S. PATENT DOCUMENTS

| | | | | | |
|---|---|---|---|---|---|
| 6,074,890 | A * | 6/2000 | Yao | B81C 1/00484 | 438/24 |
| 6,107,903 | A * | 8/2000 | Sako | H01H 51/229 | 335/78 |
| 6,115,231 | A * | 9/2000 | Shirakawa | H01H 59/0009 | 361/233 |
| 6,153,839 | A * | 11/2000 | Zavracky | H01H 59/0009 | 200/181 |
| 6,473,361 | B1 * | 10/2002 | Chen | H01H 59/0009 | 365/151 |
| 6,608,542 | B2 * | 8/2003 | Pietsch | H01H 50/28 | 335/274 |
| 6,740,946 | B2 * | 5/2004 | Funaki | H01H 59/0009 | 257/458 |
| 6,806,545 | B2 * | 10/2004 | Shim | H01H 59/0009 | 257/415 |
| 7,242,273 | B2 * | 7/2007 | Isobe | H01P 1/127 | 335/78 |
| 7,355,258 | B2 * | 4/2008 | Valenzuela | H01H 1/0094 | 333/262 |
| 7,368,846 | B2 * | 5/2008 | Mushika | G02B 26/0841 | 318/116 |
| 7,709,757 | B2 * | 5/2010 | Charvet | H01H 59/0009 | 361/207 |
| 7,745,747 | B2 * | 6/2010 | Carmona | H01H 59/0009 | 335/78 |
| 7,782,170 | B2 * | 8/2010 | Robert | H01H 59/0009 | 337/365 |
| 8,729,770 | B1 * | 5/2014 | Milanovic | G02B 26/0841 | 310/40 MM |
| 8,772,999 | B2 * | 7/2014 | Mohanty | H03H 9/2405 | 310/309 |
| 9,583,294 | B2 * | 2/2017 | Lee | H01H 1/0036 | |
| 9,748,048 | B2 * | 8/2017 | Fitzgerald | H01H 59/0009 | |
| 10,224,164 | B2 * | 3/2019 | Van Kampen | B81B 3/0097 | |
| 10,530,332 | B2 | 1/2020 | Nakamura | | |
| 11,667,516 | B2 * | 6/2023 | Renault | B81C 1/00349 | 257/414 |
| 2003/0042117 | A1 * | 3/2003 | Ma | H01H 59/0009 | 200/181 |
| 2003/0132822 | A1 * | 7/2003 | Ko | H01H 53/06 | 335/78 |
| 2003/0183887 | A1 * | 10/2003 | Lee | B81B 3/0078 | 438/48 |
| 2004/0008097 | A1 * | 1/2004 | Ma | H01H 59/0009 | 333/262 |
| 2004/0050675 | A1 * | 3/2004 | Feng | H01H 59/0009 | 200/181 |
| 2004/0061579 | A1 * | 4/2004 | Nelson | H01H 59/0009 | 335/78 |
| 2004/0113727 | A1 * | 6/2004 | Kawai | H01P 1/127 | 335/78 |
| 2005/0012562 | A1 * | 1/2005 | Shin | H01H 59/0009 | 333/262 |
| 2006/0145793 | A1 * | 7/2006 | Ning | H01H 59/0009 | 335/78 |
| 2006/0181377 | A1 * | 8/2006 | Kweon | H01H 59/0009 | 335/78 |
| 2008/0047809 | A1 * | 2/2008 | Lisec | H01P 1/127 | 29/622 |
| 2008/0190748 | A1 * | 8/2008 | Arthur | H01L 24/24 | 29/622 |
| 2009/0127082 | A1 * | 5/2009 | Zhang | H01H 59/0009 | 200/181 |
| 2010/0155202 | A1 * | 6/2010 | Ellis | H01H 11/00 | 29/622 |
| 2010/0187076 | A1 * | 7/2010 | Goggin | B81B 7/0012 | 200/283 |
| 2010/0295639 | A1 * | 11/2010 | Kawabata | B81B 3/0037 | 335/106 |
| 2012/0115269 | A1 | 5/2012 | Detry | | |
| 2012/0235537 | A1 * | 9/2012 | Masunaga | B81B 3/0072 | 310/300 |
| 2013/0126317 | A1 * | 5/2013 | Goggin | H01H 57/00 | 200/181 |
| 2014/0076697 | A1 * | 3/2014 | Gupta | B81B 3/0013 | 200/181 |
| 2014/0238828 | A1 * | 8/2014 | Van Kampen | B81B 7/04 | 200/181 |
| 2015/0355457 | A1 * | 12/2015 | Matsumoto | B81C 1/00039 | 359/234 |
| 2016/0023244 | A1 * | 1/2016 | Zhuang | B81B 3/0037 | 29/829 |
| 2016/0134256 | A1 * | 5/2016 | Kare | H03H 9/145 | 333/101 |
| 2016/0268084 | A1 * | 9/2016 | Gudeman | H01H 49/00 | |
| 2017/0098509 | A1 * | 4/2017 | Gupta | H01G 5/40 | |
| 2017/0283249 | A1 * | 10/2017 | Dogiamis | B81C 1/0015 | |
| 2019/0285196 | A1 | 9/2019 | Giusti | | |
| 2021/0185856 | A1 | 6/2021 | Ganti | | |
| 2023/0011561 | A1 * | 1/2023 | Qian | H04R 31/00 | |
| 2023/0012046 | A1 * | 1/2023 | Qian | B81B 3/0072 | |

FOREIGN PATENT DOCUMENTS

| | | |
|---|---|---|
| JP | 2003-273370 A | 9/2003 |
| JP | 2013-154465 A | 8/2013 |
| TW | 201213764 A1 | 4/2012 |
| WO | 00/38209 A1 | 6/2000 |

* cited by examiner

CANTILEVER STRUCTURE WITH INTERMEDIATE SUBSTRATE CONNECTION HAVING A FILM WITH ON ANCHOR WITH PROTRUSION

CROSS REFERENCE TO RELATED APPLICATIONS

This application claims the benefit of U.S. Provisional Application No. 63/433,763, filed on Dec. 20, 2022. The content of the application is incorporated herein by reference.

BACKGROUND OF THE INVENTION

1. Field of the Invention

The present application relates to a cantilever structure and a device, and more particularly, to a cantilever structure having some properties that have lower changes with respect to a fabricating variation caused by a fabricating process, and to a related device.

2. Description of the Prior Art

Cantilever structures can be widely used in various electronic components, such as acoustic components, air-pulse generating components, sensors, oscillators, or other suitable components. In some cases, since the cantilever structure would be a MEMS (Micro Electro Mechanical System) structure to have a small size, the size of the electronic component including the cantilever structure would be significantly reduced, thereby widely using in various electronic devices.

However, some properties (e.g., the resonant frequency, the stiffness and the initial deflection) of the cantilever structure would be changed due to the fabricating variation caused by the fabricating process. If the changes of these properties are large, the performance of the cantilever structure would be decreased because these properties are far from their design values. Thus, it is necessary to improve the structure of the cantilever structure, so as to decrease the changes of its properties which are caused by the fabricating variation.

SUMMARY OF THE INVENTION

It is therefore a primary objective of the present invention to provide a cantilever structure, wherein an anchor portion of the cantilever structure has at least one protrusion to make some properties (e.g., the resonant frequency, the stiffness and the initial deflection) have lower changes with respect to a fabricating process variation. The present invention also provides a related device.

An embodiment of the present invention provides a cantilever structure including an anchor portion and a film structure. The film structure covers over a cavity and vibrates within the cavity. A length of the film structure is less than a width of the film structure. The anchor portion includes at least one protrusion protruding toward the cavity, and the film structure is anchored on the anchor portion with the at least one protrusion.

Another embodiment of the present invention provides a device including a first cantilever structure and a second cantilever structure. The first cantilever structure includes a first film structure anchored on an anchor portion. The second cantilever structure includes a second film structure anchored on the anchor portion. A cavity is formed within the device. The first film structure and the second film structure cover over the cavity and vibrate within the cavity. A length of the first film structure is less than a width of the first film structure, and a length of the second film structure is less than a width of the second film structure. The anchor portion includes a plurality of protrusions protruding toward the cavity, and the first film structure and the second film structure are anchored on the anchor portion with the plurality of protrusions. The first film structure is adjacent and opposite to the second film structure.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to those skilled in the art, preferred embodiments and typical material or range parameters for key components will be detailed in the follow description. These preferred embodiments of the present invention are illustrated in the accompanying drawings with numbered elements to elaborate on the contents and effects to be achieved. It should be noted that the drawings are simplified schematics, and the material and parameter ranges of key components are illustrative based on the present day technology, and therefore show only the components and combinations associated with the present invention, so as to provide a clearer description for the basic structure, implementing or operation method of the present invention. The components would be more complex in reality and the ranges of parameters or material used may evolve as technology progresses in the future. In addition, for ease of explanation, the components shown in the drawings may not represent their actual number, shape, and dimensions; details may be adjusted according to design requirements.

In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present invention, the corresponding features, areas, steps, operations and/or components would be pointed to existence, but not limited to the existence of one or a plurality of the corresponding features, areas, steps, operations and/or components.

In the following description and in the claims, when "a A1 component is formed by/of B1", B1 exist in the formation of A1 component or B1 is used in the formation of A1 component, and the existence and use of one or a plurality of other features, areas, steps, operations and/or components are not excluded in the formation of A1 component.

In the following description and in the claims, the term "substantially" generally means a small deviation may exist or not exist. For instance, the terms "substantially parallel" and "substantially along" means that an angle between two components may be less than or equal to a certain degree threshold, e.g., 10 degrees, 5 degrees, 3 degrees or 1 degree. For instance, the term "substantially aligned" means that a deviation between two components may be less than or equal to a certain difference threshold, e.g., 2 μm or 1 μm. For instance, the term "substantially the same" means that a deviation is within, e.g., 10% of a given value or range, or mean within 5%, 3%, 2%, 1%, or 0.5% of a given value or range.

In the description and following claims, the term "horizontal direction" generally means a direction parallel to a horizontal plane, the term "horizontal plane" generally means a plane parallel to a direction X and a direction Y in the drawings (i.e., the direction X and the direction Y of the present invention may be considered as the horizontal directions), the term "vertical direction" and the term "top-view direction" generally mean a direction parallel to a direction Z and perpendicular to the horizontal direction in the drawings, and the direction X, the direction Y and the direction Z are perpendicular to each other. In the description and following claims, the term "top view" generally means a viewing result viewing along the vertical direction. In the description and following claims, and the term "bottom view" means a viewing result viewing along another vertical direction opposite to the vertical direction related to the top view. In the description and following claims, the term "cross-sectional view" generally means a viewing result viewing a structure cutting along the vertical direction along the horizontal direction.

Although terms such as first, second, third, etc., may be used to describe diverse constituent elements, such constituent elements are not limited by the terms. The terms are used only to discriminate a constituent element from other constituent elements in the specification, and the terms do not relate to the sequence of the manufacture if the specification do not describe. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present invention.

In the present invention, a cantilever structure is provided, wherein the cantilever structure may be used in any suitable component.

In some embodiments, the cantilever structure may be applied to an acoustic component related to an acoustic wave (e.g., a sound wave and/or an ultrasonic wave). In some cases, the cantilever structure of the acoustic component may be directly related to the acoustic wave. For example, the acoustic component (or the cantilever structure) may generate the acoustic wave or receive the acoustic wave, or the acoustic component may be a path which the acoustic wave passes through. For example, the acoustic component (or the cantilever structure) may enhance the experience of the user using an acoustic device having the acoustic component.

The acoustic component (or the cantilever structure) may be controlled by signals, or may generate signals according to an acoustic wave, wherein the signals may be electric signals or signals with other suitable type.

In some embodiments, the acoustic component may be an acoustic transducer configured to perform an acoustic transformation (e.g., the cantilever structure performs the acoustic transformation), wherein the acoustic transformation may convert the signals (e.g. electric signals) into the acoustic wave, or may convert the acoustic wave into signals with other suitable type (e.g. electric signals), but not limited thereto. For example, the acoustic transducer may be a sound producing component, a speaker, a micro speaker or other suitable device, so as to convert the electric signals into the acoustic wave, but not limited thereto. For example, the acoustic transducer may be a sound measuring device, a sound pressure sensing device, a microphone or other suitable device, so as to convert the acoustic wave into the electric signals, but not limited thereto.

In some embodiments, the acoustic component may be a venting component in the acoustic device, and a size of a venting opening of the venting component may be controlled by the electric signal (e.g., the venting opening is caused by the cantilever structure). For example, the venting component may be configured to suppress an occlusion effect during the operation of the acoustic device (e.g., an in-ear earbud, an on-ear earphone or an over-ear earphone, etc.). The occlusion effect is due to the sealed volume of ear canal causing loud perceived sound pressure by the user (i.e., the listener). In some cases, the occlusion effect occurs while the user does specific motion(s) generating a bone-conducted sound (such as walking, jogging, talking, eating, touching the acoustic transducer, etc.) and uses the acoustic device filled in the user's ear canal, and the occlusion effect causes the user to hear the occlusion noise, thereby decreasing the listening quality of the user. Thus, because of the existence of the venting component, the volume of ear canal is not sealed when the venting opening of the venting component is opened, such that the occlusion effect may be suppressed, thereby enhancing the performance of the acoustic device and the experience of the user using the acoustic device.

In some embodiments, the cantilever structure may be a MEMS (Micro Electro Mechanical System) structure in a MEMS component, but not limited thereto. Also, in some embodiments, the acoustic component including the cantilever structure may be a MEMS (Micro Electro Mechanical System) component, but not limited thereto. Namely, the above component (e.g., the acoustic transducer, the venting component or any other suitable component related to acoustics) may be formed by semiconductor process, such that a microstructure in the above component may be a MEMS structure, but not limited thereto.

In some embodiments, the cantilever structure may be packaged in a package structure. Thus, the acoustic component including the cantilever structure may be the package structure, but not limited thereto.

In the following, for instance, the cantilever structure may generate the acoustic wave, such that the acoustic component including the cantilever structure may be the acoustic transducer generating the acoustic wave, and the cantilever structure may be a MEMS structure in a MEMS component, but not limited thereto.

Figure 1:
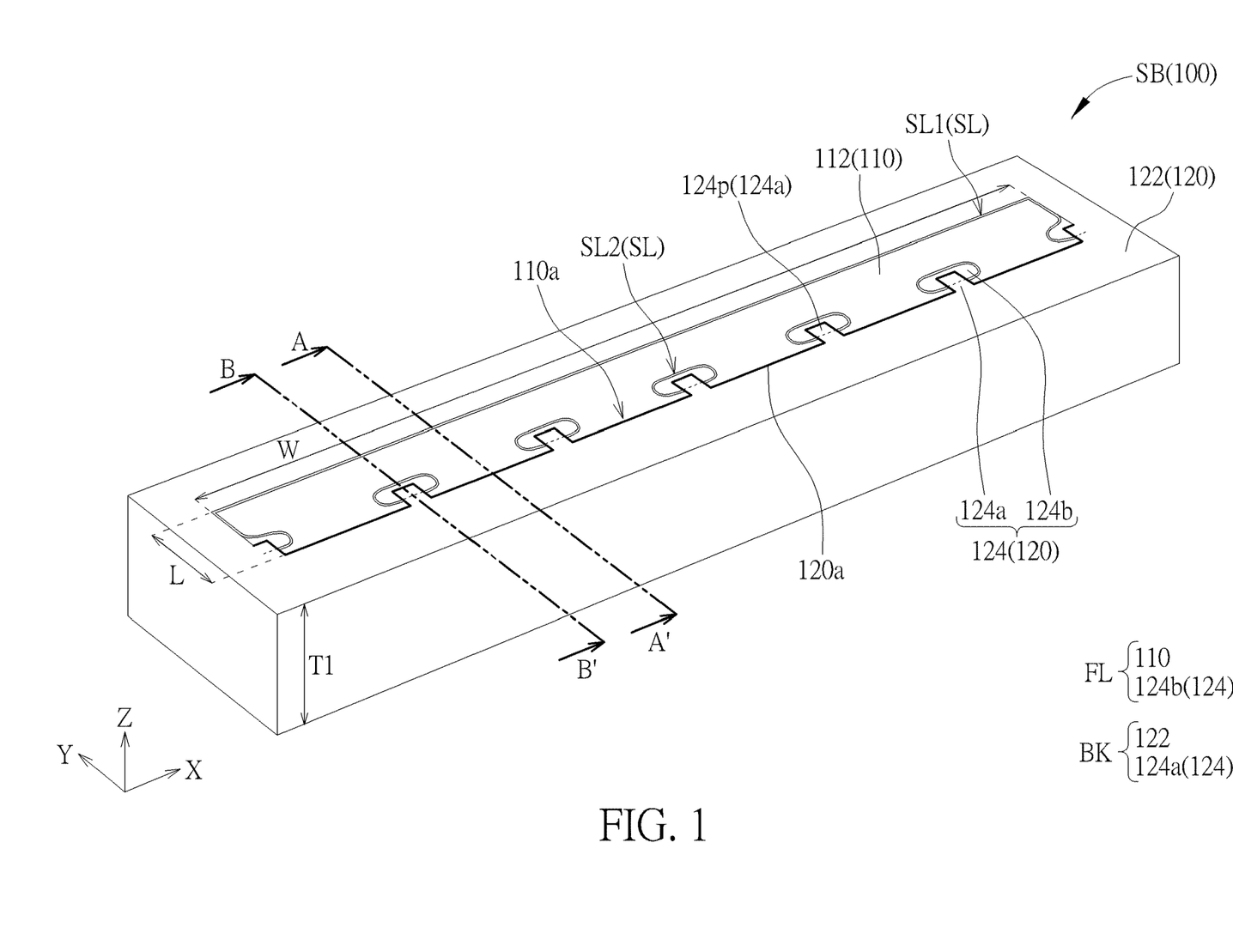
FIG. 1 and FIG. 2 are schematic diagrams illustrating a cantilever structure according to a first embodiment of the present invention.
Figure 2:
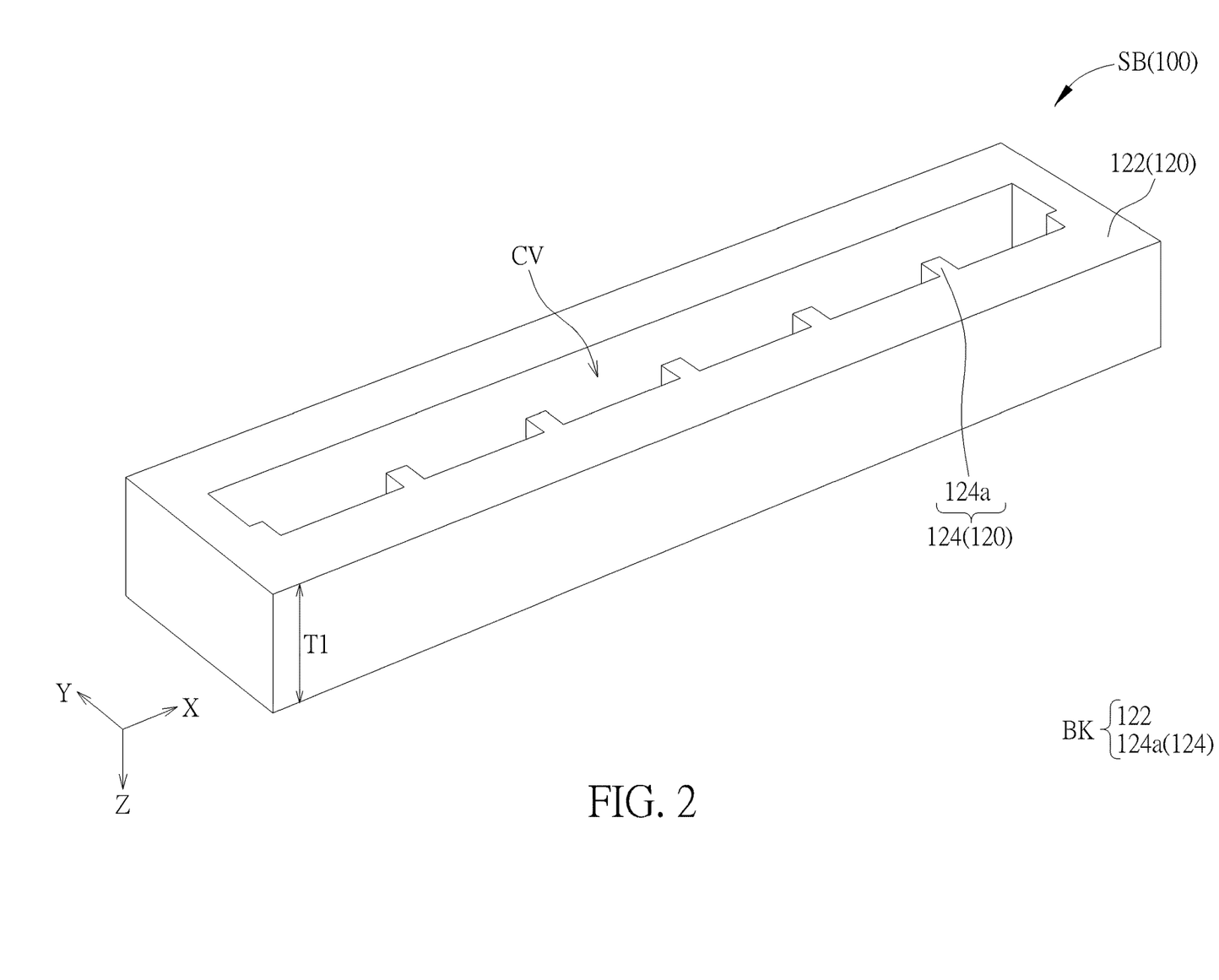
Figure 3:
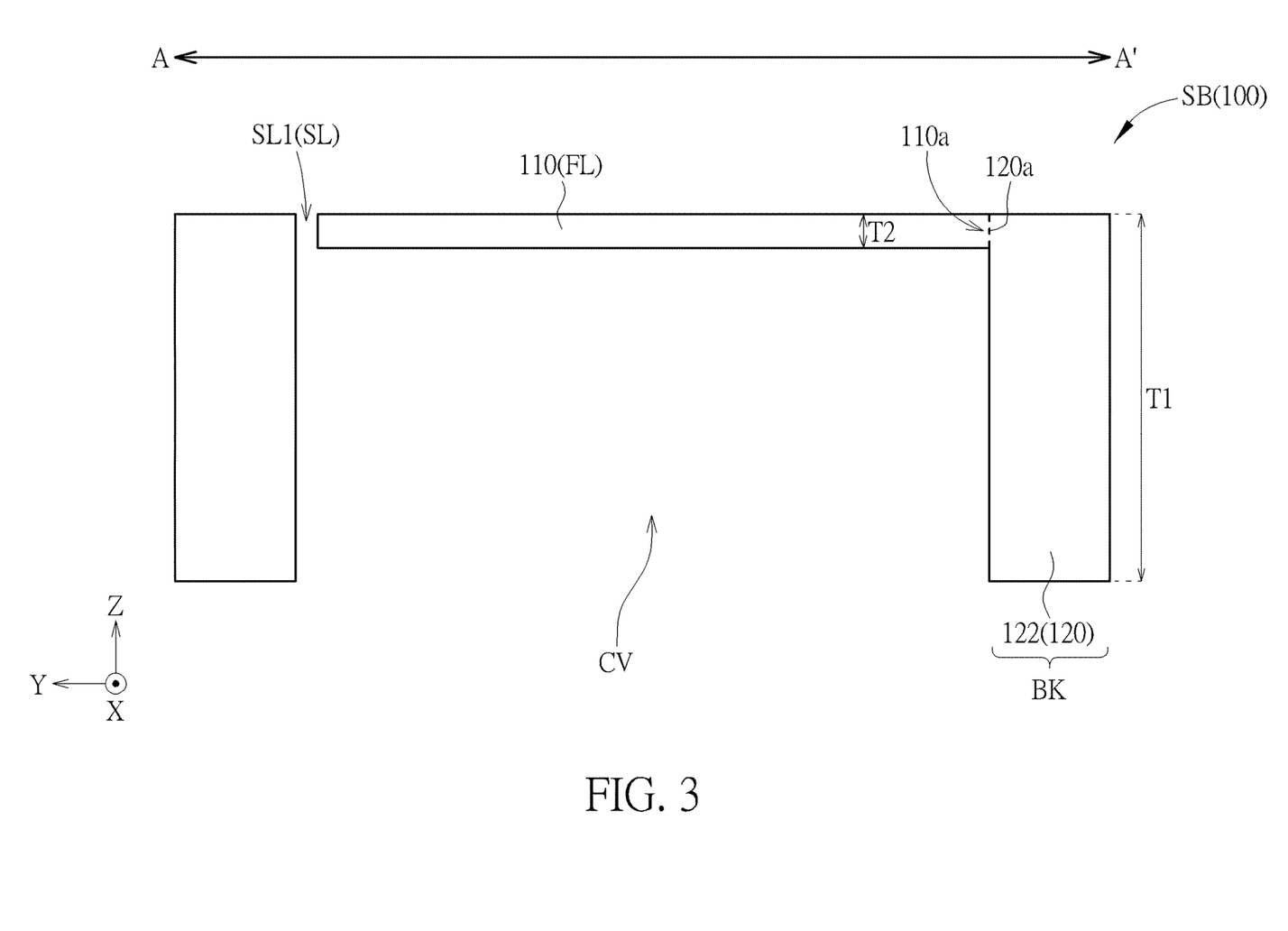
FIG. 3 is a schematic diagram of a cross-sectional view illustrating a structure taken along a cross-sectional line A-A' in FIG. 1.
Figure 4:
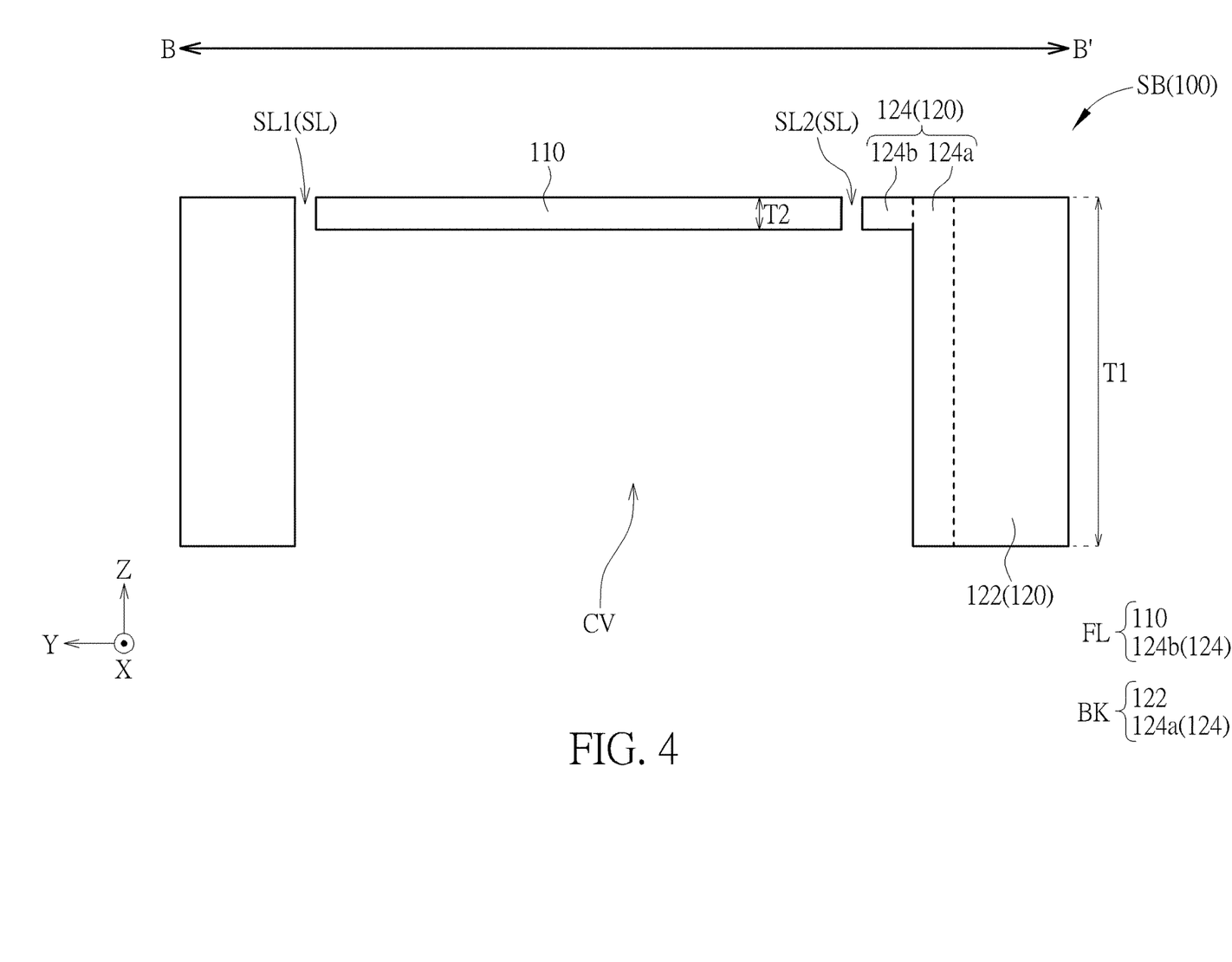
FIG. 4 is a schematic diagram of a cross-sectional view illustrating a structure taken along a cross-sectional line B-B' in FIG. 1.

Referring to FIG. 1 to FIG. 4, FIG. 1 and FIG. 2 are schematic diagrams illustrating a cantilever structure according to a first embodiment of the present invention, FIG. 3 is a schematic diagram of a cross-sectional view illustrating a structure taken along a cross-sectional line A-A' in FIG. 1, and FIG. 4 is a schematic diagram of a cross-sectional view illustrating a structure taken along a cross-sectional line B-B' in FIG. 1. As shown in FIG. 1 to FIG. 4, the cantilever structure 100 may include a substrate SB, wherein the substrate SB may include any suitable material based on requirement(s). In some embodiments, since the cantilever structure 100 is a MEMS structure in a MEMS component (e.g., a MEMS chip), the material of the substrate SB may be formed and/or etched by the semiconductor process. In this case, for example, the substrate SB may include silicon (e.g., single crystalline silicon or polycrystalline silicon), silicon compound (e.g., silicon carbide, silicon oxide), germanium, germanium compound, gallium, gallium compound (e.g., gallium nitride or gallium arsenide), any other suitable material or a combination thereof. Note that a normal direction of the substrate SB may be parallel to the direction Z.

As shown in FIG. 1 to FIG. 4, the substrate SB is etched to form a cavity CV within the substrate SB (i.e., the cavity CV is formed within the cantilever structure 100), and a film layer FL and a blocky structure BK included in the substrate SB are correspondingly formed, wherein the film layer FL covers over the cavity CV (i.e., the film layer FL is corresponding to and overlaps the cavity CV in the direction Z), the blocky structure BK is disposed outside the film layer FL and directly connected to the film layer FL, and a first thickness T1 of the blocky structure BK is greater than a second thickness T2 of the film layer FL. For instance, in FIG. 1, the film layer FL and the cavity CV may be surrounded by the blocky structure BK, but not limited thereto. Note that the film layer FL is corresponding to the removed part of the substrate SB in the direction Z, and the blocky structure BK is a non-etched part of the substrate SB.

In another aspect, as shown in FIG. 1 to FIG. 4, after forming the cavity CV, a film structure 110 and an anchor portion 120 included in the substrate SB are correspondingly formed also, wherein the film structure 110 is anchored on the anchor portion 120 and covers over the cavity CV (i.e., the film structure 110 is corresponding to and overlaps the cavity CV in the direction Z), and the anchor portion 120 is disposed outside the film structure 110. For instance, in FIG. 1, the film structure 110 may be surrounded by the anchor portion 120, but not limited thereto.

In FIG. 1 to FIG. 4, the film structure 110 and a part of the anchor portion 120 belong to the film layer FL (i.e., the film structure 110 and a part of the anchor portion 120 are formed within the film layer FL), and another part of the anchor portion 120 belongs to the blocky structure BK. Note that the anchor portion 120 has two different thicknesses since the anchor portion 120 has a part belonging to the film layer FL and another part belonging to the blocky structure BK.

In the operation of the cantilever structure 100, the film structure 110 may be actuated to have a movement and vibrate within the cavity CV, and the anchor portion 120 may be immobilized. Namely, the anchor portion 120 may be a fixed end (or fixed edge) respecting the film structure 110 during the operation of the cantilever structure 100. In some embodiments, the film structure 110 may be actuated to move upwards and downwards, but not limited thereto. In the present invention, the terms "move upwards" and "move downwards" represent that the film structure 110 moves substantially along the direction Z.

In FIG. 1, the film structure 110 has only one anchor side 110a to make it anchored on the anchor portion 120, and other sides of the film structure 110 are non-anchor sides. Namely, the film structure 110 may be one cantilever.

In FIG. 1, the anchor portion 120 includes an anchor edge 120a, and the anchor side 110a of the film structure 110 is anchored on the anchor edge 120a of the anchor portion 120, so as to make the film structure 110 be anchored on the anchor portion 120. In FIG. 1, the anchor edge 120a of the anchor portion 120 is an edge of the blocky structure BK. Namely, the anchor edge 120a of the anchor portion 120 is a boundary of the blocky structure BK with the first thickness T1.

As shown in FIG. 1 to FIG. 4, the anchor portion 120 includes a blocky part 122 and at least one protrusion 124 protruding from the blocky part 122 toward the cavity CV. The blocky part 122 belongs to the blocky structure BK, so as to have the first thickness T1. Each protrusion 124 includes a first part 124a and a second part 124b directly connected to each other, wherein the first part 124a belongs to the blocky structure BK to substantially have the first thickness T1, and the second part 124b belongs to the film layer FL to substantially have the second thickness T2 less than the first thickness T1 (i.e., in the film layer FL, the second part 124b and the film structure 110 substantially have the same thickness). Note that the anchor edge 120a of the anchor portion 120 which is a boundary of the blocky structure BK is an edge with at least one protruding part because of the existence of at least one protrusion 124 (i.e., the anchor edge 120a of the anchor portion 120 is formed by the blocky part 122 and the first part 124a of the protrusion 124).

As shown in FIG. 1 and FIG. 4, the first part 124a of the protrusion 124 is between the second part 124b of the protrusion 124 and the blocky part 122, and the second part 124b of the protrusion 124 is between the first part 124a of the protrusion 124 and the film structure 110. As shown in FIG. 1 and FIG. 4, the film structure 110 is directly connected to (anchored on) the blocky part 122 and the first part 124a of the protrusion 124, and the film structure 110 is separated from the second part 124b of the protrusion 124 to be not directly connected to (not anchored on) the second part 124b of the protrusion 124. In some embodiments, in FIG. 1, the first part 124a may project into the second part 124b in the top view, wherein a projecting portion 124p of the first part 124a projecting into the second part 124b may not be directly connected to the film structure 110, but not limited thereto.

Note that, the protrusion 124 functions as intermediate substrate connection which also provides anchor function, so that the distance between cantilever tip to anchor along width direction would be more uniform than the case without the protrusion 124, the intermediate substrate connection.

The shape of the protrusion 124 and the shape of the blocky part 122 may be designed based on requirement(s). The shape of the blocky part 122 may be a suitable shape with a suitable hollow forming the cavity CV, wherein the suitable shape may be a polygon (e.g., a rectangle), a shape having a curved edge (e.g., a circle, an oval) or other suitable shape. Each of the shapes of the first part 124a and the second part 124b of the protrusion 124 may be a polygon (e.g., a rectangle), a shape having a curved edge (e.g., a circle, an oval) or other suitable shape. For example, in FIG. 1, the blocky part 122 may be a rectangle with a rectangular hollow, the first part 124a of the protrusion 124 may be a rectangle, and a combination of the second part 124b and the projecting portion 124p of the first part 124a of the protrusion 124 may be a shape having two opposite straight edges and two opposite curved edges, but not limited thereto.

In the present invention, the number of the protrusion(s) 124 may be designed based on requirement(s). In FIG. 1 and FIG. 2, the anchor portion 120 includes a plurality of protrusions 124, and the arrangement of the protrusions 124 may be designed based on requirement(s). For instance, in FIG. 1 and FIG. 2, the anchor portion 120 includes seven protrusions 124 evenly distributed over the anchor side 110a of the film structure 110 (the anchor edge 120a of the anchor portion 120), but not limited thereto.

In order to form the aforementioned design of the film structure 110, the cantilever structure 100 includes at least one slit SL formed on the film layer FL and passing through the film layer FL, so as to define the film structure 110 and the second part 124b of the protrusion 124. In the present invention, the number of the slit(s) SL may be adjusted based on requirement(s), and the slit(s) SL may be disposed at any suitable position of the film layer FL and have any suitable top-view pattern. For example, the slit SL may be a straight slit, a curved slit, a combination of straight slits, a combination of curved slits or a combination of straight slit(s) and curved slit(s). For instance, in this embodiment, the cantilever structure 100 may include a plurality of slits SL formed on the film layer FL.

In FIG. 1, FIG. 3 and FIG. 4, the slits SL include a plurality of outer slits SL1 surrounding the film structure 110, such that the film structure 110 is separated from the anchor portion 120 at the non-anchor sides. In FIG. 1, the film structure 110 is formed because of the existence of the outer slits SL1. For example, in FIG. 1, three outer slits SL1 are formed to surround the film structure 110, and each outer slit SL1 is a straight slit, but not limited thereto.

In FIG. 1 and FIG. 4, the slits SL include a plurality of inner slits SL2, wherein each inner slit SL2 is between the second part 124b of the protrusion 124 and the film structure 110, such that the film structure 110 is separated from the second part 124b of the protrusion 124 by the inner slit SL2. In FIG. 1, the second part 124b of the protrusion 124 is formed because of the existence of the inner slit SL2, and one inner slit SL2 is corresponding to the second part 124b of one protrusion 124. For example, in FIG. 1, seven inner slits SL2 are formed on the film layer FL and pass through the film layer FL, and each inner slit SL2 is a combination of straight slit(s) and curved slit(s). For example, in FIG. 1, two outer slits SL1 are respectively connected to two inner slits SL2, but not limited thereto.

According to the aforementioned arrangement, in FIG. 1, the film structure 110 may include a plurality of sub-parts 112 divided by the protrusions 124 (in FIG. 1, the film structure 110 include six sub-parts 112), such that one of the protrusions 124 and one of the inner slits SL2 are between adjacent two of the sub-parts 112. In FIG. 1, the sub-parts 112 are connected to each other (i.e., the sub-parts 112 are not separated from each other).

In the present invention, the size of the film structure 110 may be designed based on requirement(s). In some embodiments, in FIG. 1, a length L of the film structure 110 in the direction Y may be less than a width W of the film structure 110 in the direction X, so as to maximize the use of the MEMS component (e.g., the MEMS chip) which is configured to form the cantilever structure 100 and formed by the semiconductor process. For example, the width W of the film structure 110 is larger than 2 times of the length L of the film structure 110, but not limited thereto. Note that the length L of the film structure 110 is a maximum distance between the anchor side 110a of the film structure 110 (or the anchor edge 120a of the anchor portion 120) and the free side of the film structure 110 in the direction Y (i.e., a distance between an anchored end and a free end of the cantilever), and the width W of the film structure 110 is a size of the film structure 110 perpendicular to the length L.

Regarding the film structure 110 (i.e., the cantilever), the resonant frequency, the stiffness and the initial deflection of the film structure 110 are related to the length L of the film structure 110 (the length of the cantilever). For example, the resonant frequency of the film structure 110 is proportional to the length L of the film structure 110, and the stiffness of the film structure 110 is proportional to cube of length L of the film structure 110. Generally, the length L of the film structure 110 would be changed due to the fabricating variation caused by the fabricating process (e.g., the fabricating variation is a mask variation, an aligning variation, an etching variation, other variation or a combination thereof), such that the resonant frequency, the stiffness and the initial deflection of the film structure 110 would be changed due to the fabricating variation. Furthermore, if the length L of the film structure 110 is less than the width W of the film structure 110, the changes of the resonant frequency, the stiffness and the initial deflection of the film structure 110 would be more affected by the change of the length L of the film structure 110. In the present invention, since the protrusion 124 of the anchor portion 120 exists to divide the film structure 110 into a plurality of sub-parts 112, the changes of the resonant frequency, the stiffness and the initial deflection of the film structure 110 would be decreased when the length L of the film structure 110 is changed due to the fabricating variation. In some cases, the length of the protrusion 124 is correspondingly increased/decreased as the length L of the film structure 110 is increased/decreased (i.e., the fabricating variation occurs at the anchor side 110a of the film structure 110), so as to reduce the changes of the resonant frequency, the stiffness and the initial deflection of the film structure 110 caused by the change of the length L of the film structure 110. Also, since the protrusion 124 has the second part 124b, when the fabricating variation causes the manufacture error (e.g., the size error and/or the shifting error) of the first part 124a of the protrusion 124, the second part 124b of the protrusion 124 would serve as a buffer region to decrease the influence of this manufacture error on the film structure 110.

In the film structure 110 of the present invention, a first ratio is a changing rate of the resonant frequency of the film structure 110 with respect to the length L of the film structure 110 ($\Delta f/\Delta L$). In a conventional film structure without the protrusion (i.e., the conventional design), a second ratio is a changing rate of a resonant frequency of this conventional film structure with respect to a length of this conventional film structure ($\Delta f'/\Delta L'$). The first ratio is less than the second ratio. For example, the first ratio may be less than half of the second ratio, but not limited thereto.

For instance, in a comparison between a cantilever structure of an embodiment of the present invention (e.g., the cantilever structure 100 shown in FIG. 1 to FIG. 4) and a conventional cantilever structure which is similar to this cantilever structure of the present invention but does not have the protrusion 124, the first ratio of the film structure 110 of the cantilever structure of the present invention may be 0.79 kHz/μm, and the second ratio of the conventional film structure of the conventional cantilever structure may be 1.77 kHz/μm, such that a ratio of the first ratio to the second ratio is 0.446 (i.e., the improvement caused by the protrusion(s) 124 of the present invention may be 55.4%), but not limited thereto. Note that this first ratio and this second ratio are experimental data, and these ratios would not restrict the present invention.

The cantilever structure 100 may further include any suitable structure and/or component. In some embodiments, since the acoustic component including the cantilever structure may be the acoustic transducer generating the acoustic wave, the cantilever structure 100 includes an actuator disposed on the film structure 110 and configured to actuate the film structure 110. For instance, the actuator may be disposed on the film structure 110 in the direction Z, but not limited thereto.

The actuator has a monotonic electromechanical converting function with respect to the movement of the film structure 110 along the direction Z. In some embodiments, the actuator may include a piezoelectric actuator, an electrostatic actuator, a nanoscopic-electrostatic-drive (NED) actuator, an electromagnetic actuator or any other suitable actuator, but not limited thereto. For example, in an embodiment, the actuator may include a piezoelectric actuator, the piezoelectric actuator may contain such as two electrodes and a piezoelectric material layer (e.g., lead zirconate titanate, PZT) disposed between the electrodes, wherein the piezoelectric material layer may actuate the film structure 110 based on driving signals (e.g., driving voltages and/or driving voltage difference between two electrodes) received by the electrodes, but not limited thereto. For example, in another embodiment, the actuator may include an electromagnetic actuator (such as a planar coil), wherein the electromagnetic actuator may actuate the film structure 110 based on a received driving signals (e.g., driving current) and a magnetic field (i.e. the film structure 110 may be actuated by the electromagnetic force), but not limited thereto. For example, in still another embodiment, the actuator may include an electrostatic actuator (such as conducting plate) or a NED actuator, wherein the electrostatic actuator or the NED actuator may actuate the film structure 110 based on a received driving signals (e.g., driving voltage) and an electrostatic field (i.e. the film structure 110 may be actuated by the electrostatic force), but not limited thereto.

The cantilever structure of the present invention is not limited by the above embodiment. Other embodiments of the present invention are described below. For ease of comparison, same components will be labeled with the same symbol in the following. The following descriptions relate the differences between each of the embodiments, and repeated parts will not be redundantly described.

Figure 5:
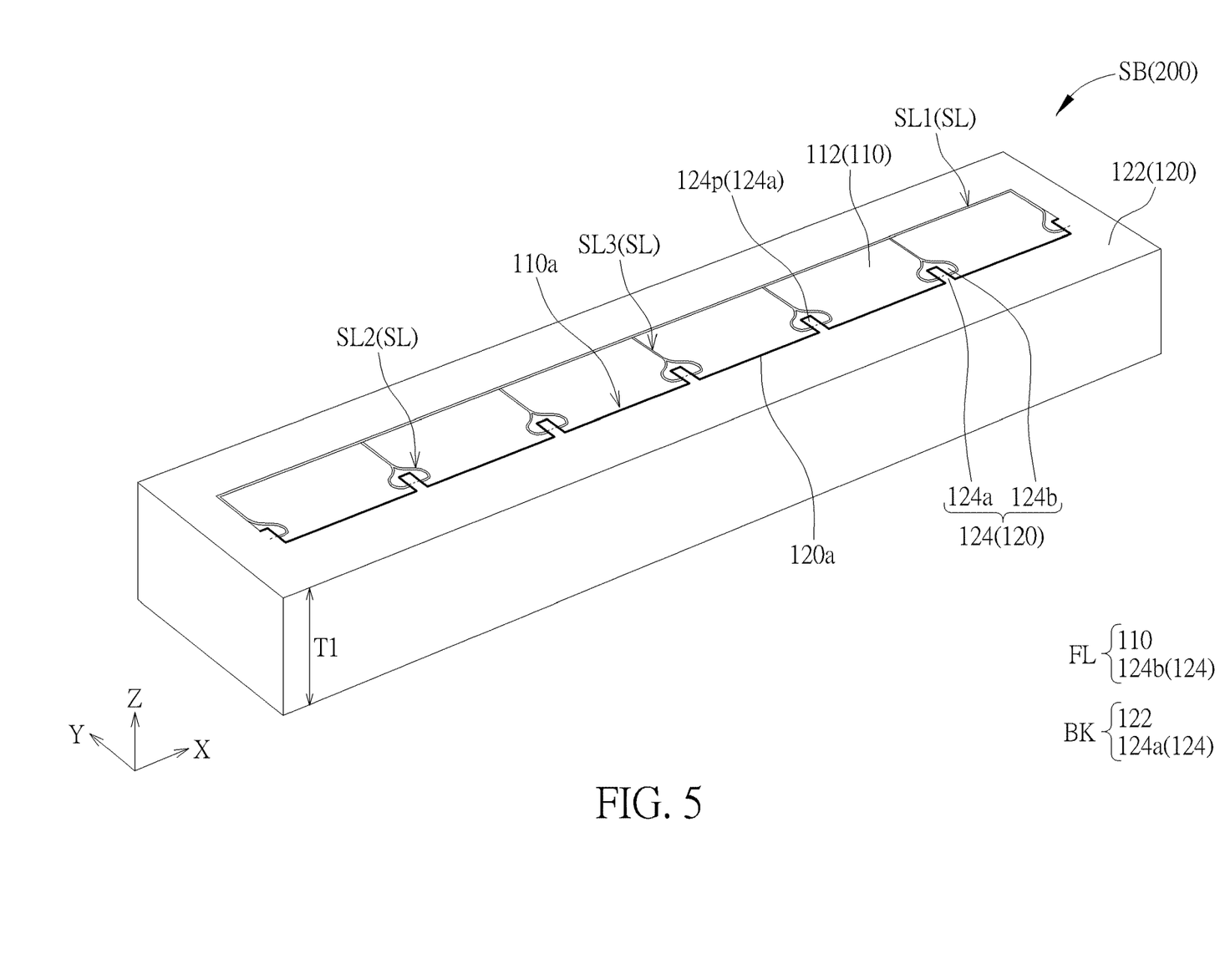
FIG. 5 is a schematic diagram illustrating a cantilever structure according to a second embodiment of the present invention.

Referring to FIG. 5, FIG. 5 is a schematic diagram illustrating a cantilever structure according to a second embodiment of the present invention. As shown in FIG. 5, the slits SL of the cantilever structure 200 further include at least one splitting slit SL3 between adjacent two of the sub-parts 112 of the film structure 110, so as to separate adjacent two of the sub-parts 112 of the film structure 110. In FIG. 5, the splitting slit SL3 is corresponding to one protrusion 124. For example, one splitting slit SL3 is connected between one inner slit SL2 corresponding to the second part 124b of one protrusion 124 and one outer slit SL1.

The number of the splitting slit(s) SL3 may be designed based on requirement(s). For example, the slits SL include five splitting slits SL3 to separate all sub-parts 112 (e.g., six sub-parts 112 in FIG. 5) of the film structure 110, but not limited thereto.

In FIG. 5, a combination of the second part 124b and the projecting portion 124p of the first part 124a of the protrusion 124 may be a peach shape, such that the inner slit SL2 may be a combination of curved slits, but not limited thereto.

Note that, the cantilever structure of the present invention may be applied to acoustic transducer, sound producing device. Specifically, the cantilever structure of the present invention may be applied to air-pulse generating device disclosed in U.S. application Ser. No. 17/553,806 and Ser. No. 18/321,759 filed by Applicant. Content of Ser. No. 17/533,806 and Ser. No. 18/321,759 is incorporated herein by reference.

Figure 6:
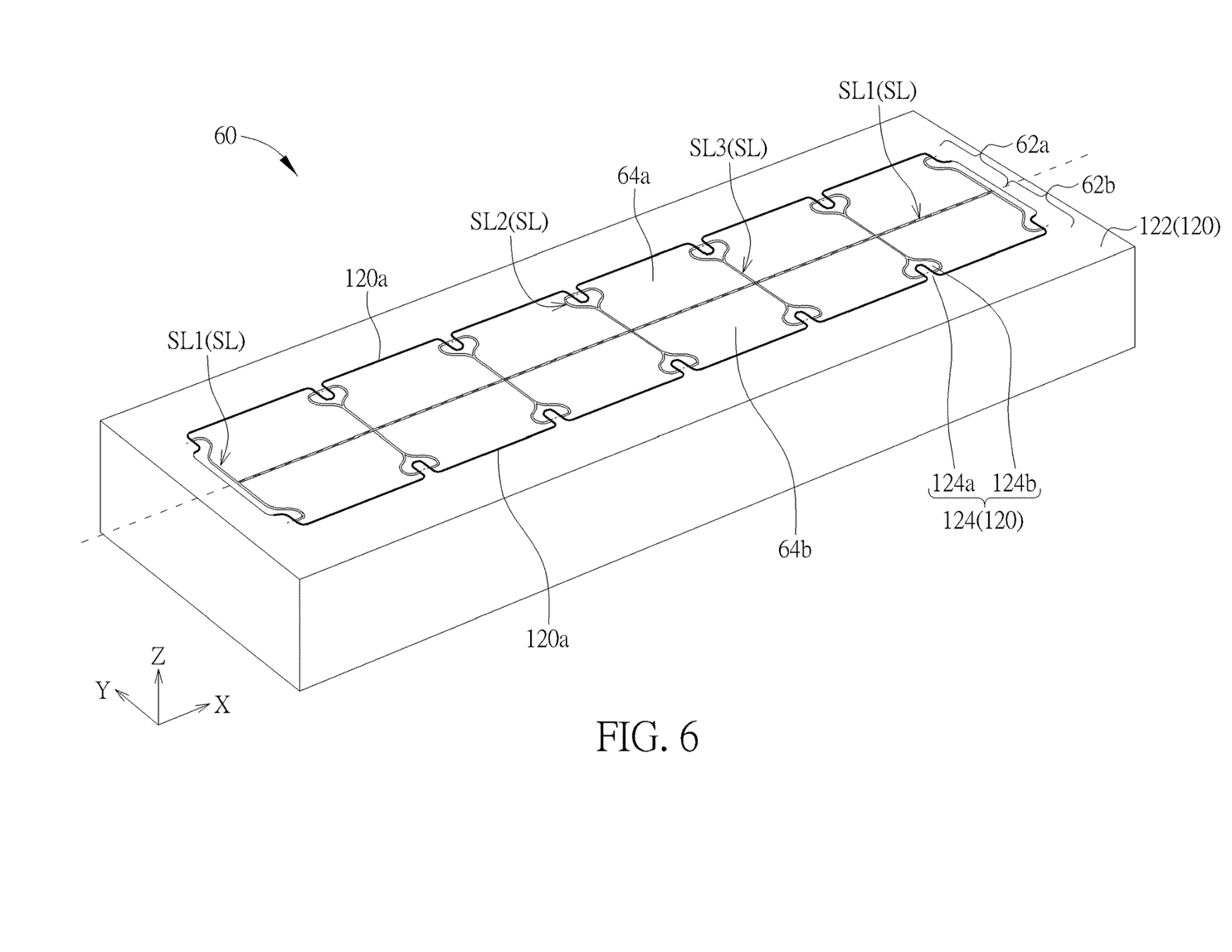
FIG. 6 is a schematic diagram illustrating a device according to an embodiment of the present invention.

Referring to FIG. 6, FIG. 6 is a schematic diagram illustrating a device 60 according to an embodiment of the present invention. The device 60 may be a sound producing device or an air-pulse generating device, which is disclosed in Ser. No. 18/321,759 incorporating the intermediate substrate connection, the protrusion 124, thereinto. That is, different from the device disclosed in Ser. No. 18/321,759, protrusions 124 (intermediate substrate connections) are included.

Figure 7:
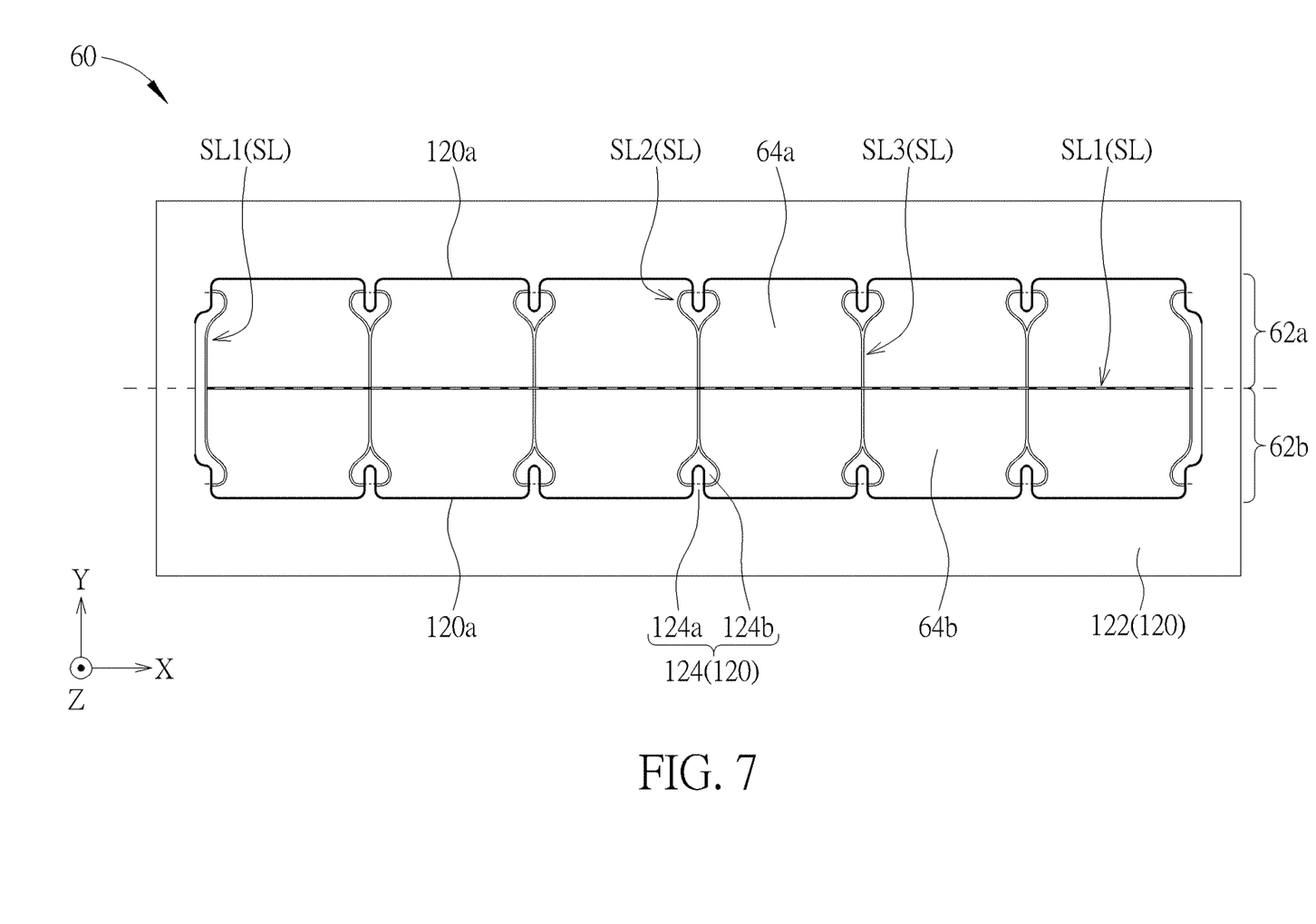
FIG. 7 is a schematic diagram of a top view illustrating the device shown in FIG. 6.
Figure 8:
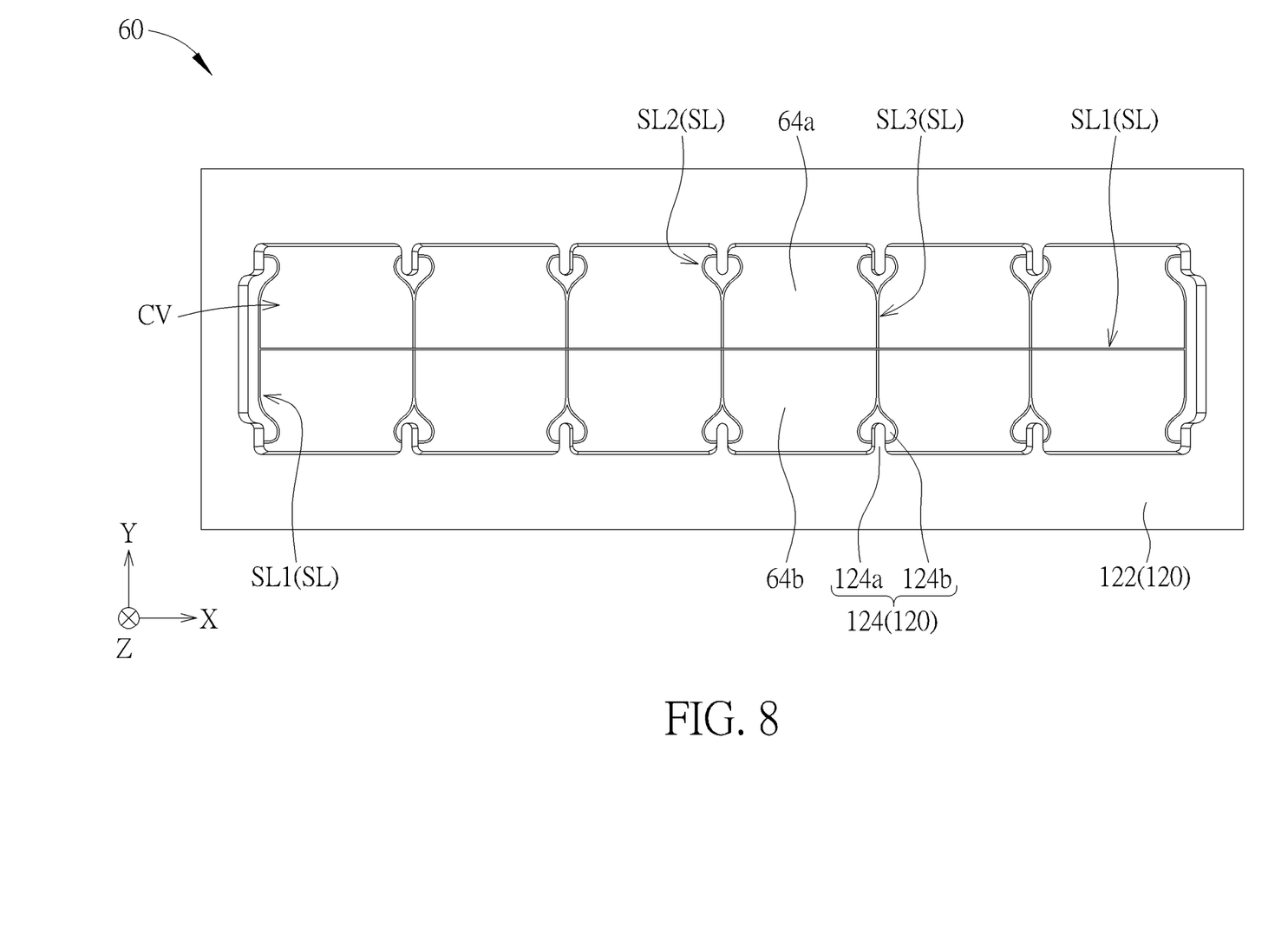
FIG. 8 is a schematic diagram of a bottom view illustrating the device shown in FIG. 6.
Figure 9:
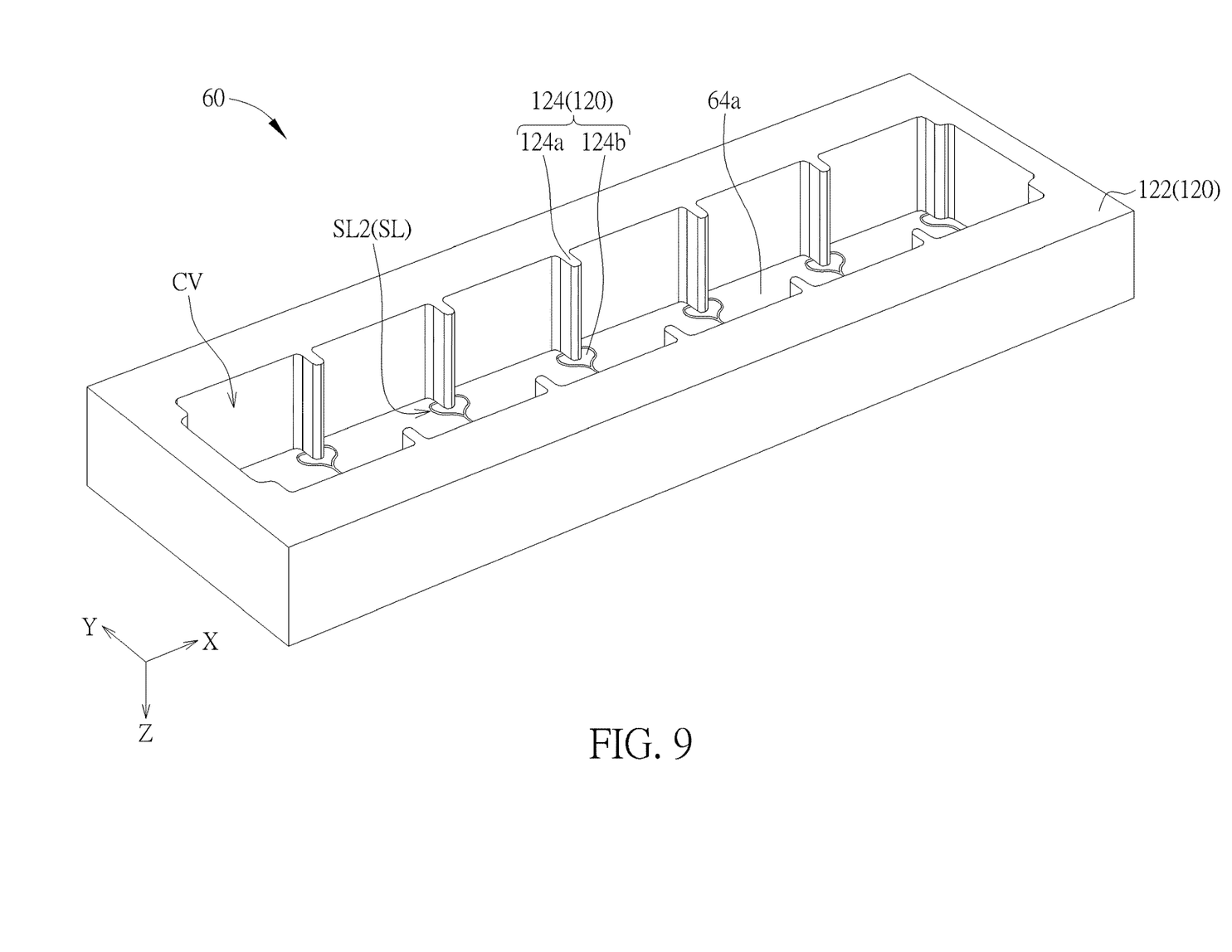
FIG. 9 is a schematic diagram illustrating the device shown in FIG. 6.

As shown FIG. 6, the device 60 includes cantilever structures 62a and 62b. The cantilever structures 62a and 62b may have similar or the same structure as the cantilever structure shown in FIG. 5, which are shown in different views in FIGS. 7-9. The cantilever structures 62a and 62b comprises film structures 64a and 64b opposite to each other and divided by one outer slit SL1. The film structures 64a and 64b in the present invention may be viewed as the flaps in Ser. No. 18/321,759.

Operational principle of the device 60 may be referred to Ser. No. 17/533,806 and Ser. No. 18/321,759. As taught in Ser. No. 17/533,806 and Ser. No. 18/321,759, the film structures within the device 60 produce an amplitude-modulated ultrasonic air wave (or air pressure variation) with an ultrasonic carrier frequency and forms an opening at an opening rate synchronous with the ultrasonic carrier frequency. The device 60 produces a plurality of air pulses at a pulse rate of the ultrasonic carrier frequency according to the amplitude-modulated ultrasonic air pressure variation. Note that, the film structures 64a and 64b may be fabricated in a single fabrication layer.

Moreover, as taught in Ser. No. 18/321,759, given the film structures 64a and 64b are fabricated in the single fabrication layer, the film structures 64a and 64b are actuated to perform a common mode movement and a differential mode movement. The film structures 64a and 64b perform the common mode movement is to form the amplitude-modulated ultrasonic air pressure variation with the ultrasonic carrier frequency; while the film structures 64a and 64b perform the differential mode movement is to form the opening at the opening rate synchronous with the ultrasonic carrier frequency.

Details of the operational principle may be referred to Ser. No. 17/533,806 and Ser. No. 18/321,759, which are narrated herein for brevity.

In the present invention, a MEMS component with a function different from the acoustic component may also have the cantilever structure of one of the above embodiments or the structure which is a combination of the above embodiments. In some embodiments, the MEMS component may be an oscillator, a thermal transducer, a light transducer, an inertial transducer, a filter, a radio-frequency (RF) MEMS component, a switch or other suitable MEMS component.

In summary, according to the design of the present invention, the changes of some properties (the resonant frequency, the stiffness and the initial deflection) of the film structure would be decreased when the length of the film structure is changed due to the fabricating variation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cantilever structure, comprising:
    an anchor portion; and
    a film structure;
    wherein the film structure covers over a cavity and vibrates within the cavity;
    wherein a length of the film structure is less than a width of the film structure;
    wherein the anchor portion comprises at least one protrusion protruding toward the cavity in a top view and in a cross-sectional view, and the film structure is anchored on the anchor portion with the at least one protrusion;
    wherein the anchor portion comprises a blocky part, the at least one protrusion protrudes from the blocky part toward the cavity, and the film structure is directly connected to the blocky part and the at least one protrusion in the top view.

2. The cantilever structure of claim 1,
    wherein the film structure is formed within a film layer;
    wherein at least one slit is formed on the film layer to surround the film structure.

3. The cantilever structure of claim 1, wherein the width of the film structure is larger than 2 times of the length of the film structure.

4. The cantilever structure of claim 1, wherein the film structure comprises a plurality of sub-parts, and one of the at least one protrusion is between adjacent two of the plurality of sub-parts.

5. The cantilever structure of claim 1, wherein the film structure comprises a plurality of sub-parts, a slit is between adjacent two of the plurality of sub-parts, and the slit is corresponding to one of the at least one protrusion.

6. The cantilever structure of claim 1, further comprising a substrate, wherein the cavity is formed within the substrate.

7. The cantilever structure of claim 6, wherein the substrate is etched to form the cavity and the anchor portion with the at least one protrusion.

8. The cantilever structure of claim 1, wherein the anchor portion comprises a plurality of protrusions.

9. The cantilever structure of claim 8,
    wherein the film structure comprises an anchor side anchored on the anchor portion;
    wherein the plurality of protrusions are evenly distributed over the anchor side.

10. The cantilever structure of claim 1, wherein each of the at least one protrusion comprises a first part and a second part, a first thickness of the first part is greater than a second thickness of the second part.

11. The cantilever structure of claim 10, wherein the film structure is directly connected to the first part, and the film structure is not directly connected to the second part.

12. The cantilever structure of claim 10, wherein the film structure is separated from the second part by an inner slit between the second part and the film structure.

13. The cantilever structure of claim 10, wherein the second part is between the first part and the film structure.

14. The cantilever structure of claim 10, wherein the first part is between the second part and the blocky part.

15. The cantilever structure of claim 10, wherein the first part projects into the second part in the top view.

16. The cantilever structure of claim 10, wherein the second thickness of the second part is the same as a thickness of the film structure.

17. The cantilever structure of claim 10, wherein the second part and the film structure are formed within a film layer, and an inner slit between the second part and the film structure is formed on the film layer.

18. A device, comprising:
    a first cantilever structure comprising a first film structure anchored on an anchor portion; and
    a second cantilever structure comprising a second film structure anchored on the anchor portion;
    wherein a cavity is formed within the device;
    wherein the first film structure and the second film structure cover over the cavity and vibrate within the cavity;
    wherein a length of the first film structure is less than a width of the first film structure, and a length of the second film structure is less than a width of the second film structure;
    wherein the anchor portion comprises a plurality of protrusions protruding toward the cavity, and the first film structure and the second film structure are anchored on the anchor portion with the plurality of protrusions;
    wherein the first film structure is adjacent and opposite to the second film structure.

19. The device of claim 18, wherein the device is an air-pulse generating device.

20. The device of claim 18,
    wherein the device produces an amplitude-modulated ultrasonic air pressure variation with an ultrasonic carrier frequency and forms an opening at an opening rate synchronous with the ultrasonic carrier frequency;
    wherein the device produces a plurality of air pulses at a pulse rate of the ultrasonic carrier frequency according to the amplitude-modulated ultrasonic air pressure variation.

21. The device of claim 20,
    wherein the first film structure and the second film structure are actuated to perform a common mode movement and a differential mode movement;
    wherein the common mode movement is to form the amplitude-modulated ultrasonic air pressure variation with the ultrasonic carrier frequency;
    wherein the differential mode movement is to form the opening at the opening rate synchronous with the ultrasonic carrier frequency.

* * * * *